US011664072B2

United States Patent
Advani et al.

(10) Patent No.: US 11,664,072 B2
(45) Date of Patent: *May 30, 2023

(54) ARCHITECTURE FOR TERNARY CONTENT-ADDRESSABLE MEMORY SEARCH

(71) Applicant: Micron Technology, Inc., Boise, ID (US)

(72) Inventors: Manik Advani, Fremont, CA (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/470,468

(22) Filed: Sep. 9, 2021

(65) Prior Publication Data

US 2021/0407595 A1   Dec. 30, 2021

Related U.S. Application Data

(63) Continuation of application No. 16/811,574, filed on Mar. 6, 2020, now Pat. No. 11,133,065.

(51) Int. Cl.
  *G11C 15/00*   (2006.01)
  *G11C 15/04*   (2006.01)
  (Continued)

(52) U.S. Cl.
  CPC ......... *G11C 15/046* (2013.01); *G11C 7/1078* (2013.01); *G11C 7/12* (2013.01);
  (Continued)

(58) Field of Classification Search
  CPC ....... G11C 15/046; G11C 7/1075; G11C 7/12; G11C 11/4082
  (Continued)

(56) References Cited

U.S. PATENT DOCUMENTS 7,596,553 B2   9/2009   Meirovitz et al.
8,166,536 B1 *  4/2012   Ammundi ........... H04L 63/0263
                                                   711/108
(Continued)

FOREIGN PATENT DOCUMENTS

TW   201810272   3/2018
TW   202145224   12/2021
WO   2021178851   9/2021

OTHER PUBLICATIONS

"International Application Serial No. PCT/US2021/021157, International Search Report dated Jun. 18, 2021", 3 pgs.
(Continued)

*Primary Examiner* — Vu A Le
(74) *Attorney, Agent, or Firm* — Schwegman Lundberg & Woessner, P.A.

(57) ABSTRACT

A search pattern is generated based on an input search word comprising a first sequence of bits. The search pattern comprises a representation of the input search word and a representation of an inverse of the input search word. The search pattern is provided as input to search lines of a ternary content-addressable memory (TCAM) block. A subset of the search lines is set to a logical high state based on a first portion of the input search word being designated as don't-care bits. The search pattern causes at least one string in the CAM block to be conductive and provide a signal in response to a data entry stored on the string comprising a second portion of the input search word that excludes the don't-care bits. A location of the data entry is determined and output.

20 Claims, 7 Drawing Sheets

(51) Int. Cl.
  *G11C 16/04* (2006.01)
  *G11C 11/408* (2006.01)
  *G11C 7/12* (2006.01)
  *G11C 7/10* (2006.01)
  *G11C 16/10* (2006.01)

(52) U.S. Cl.
  CPC ...... *G11C 11/4082* (2013.01); *G11C 16/0483* (2013.01); *G11C 16/10* (2013.01)

(58) Field of Classification Search
  USPC .......................................................... 365/49.1
  See application file for complete search history.

(56) References Cited

U.S. PATENT DOCUMENTS

| | | |
|---|---|---|
| 9,484,096 B1 | 11/2016 | Chen et al. |
| 9,728,258 B1 | 8/2017 | Chang et al. |
| 9,875,799 B1 | 1/2018 | De Santis et al. |
| 10,141,055 B2 | 11/2018 | De Santis et al. |
| 10,504,595 B1 | 12/2019 | Vu et al. |
| 11,133,065 B1 | 9/2021 | Advani et al. |
| 2015/0248936 A1 | 9/2015 | Best et al. |
| 2015/0254553 A1* | 9/2015 | Arsovski ................ G06N 3/063 706/25 |
| 2018/0040374 A1 | 2/2018 | Zheng et al. |
| 2018/0350439 A1 | 12/2018 | Watanabe et al. |
| 2019/0332708 A1 | 10/2019 | Strachan et al. |
| 2021/0280250 A1 | 9/2021 | Advani et al. |

OTHER PUBLICATIONS

"International Application Serial No. PCT/US2021/021157, Written Opinion dated Jun. 18, 2021", 4 pgs.

"Taiwanese Application Serial No. 110107924, Response Filed Feb. 15, 2022 to First Office Action dated Dec. 9, 2021", w English Claims, 45 pgs.

"Taiwanese Application Serial No. 110107924, First Office Action dated Nov. 5, 2021", w/out English translation, 3 pgs.

"Taiwanese Application Serial No. 110107924, First Office Action dated Dec. 9, 2021", w/English translation, 6 pgs.

\* cited by examiner

ARCHITECTURE FOR TERNARY CONTENT-ADDRESSABLE MEMORY SEARCH

PRIORITY APPLICATION

This application is a continuation of U.S. application Ser. No. 16/811,574, filed Mar. 6, 2020, which is incorporated herein by reference in its entirety.

TECHNICAL FIELD

Embodiments of the disclosure relate generally to memory sub-systems, and more specifically, relate to a memory component architecture to facilitate a ternary content-addressable memory (TCAM) search.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
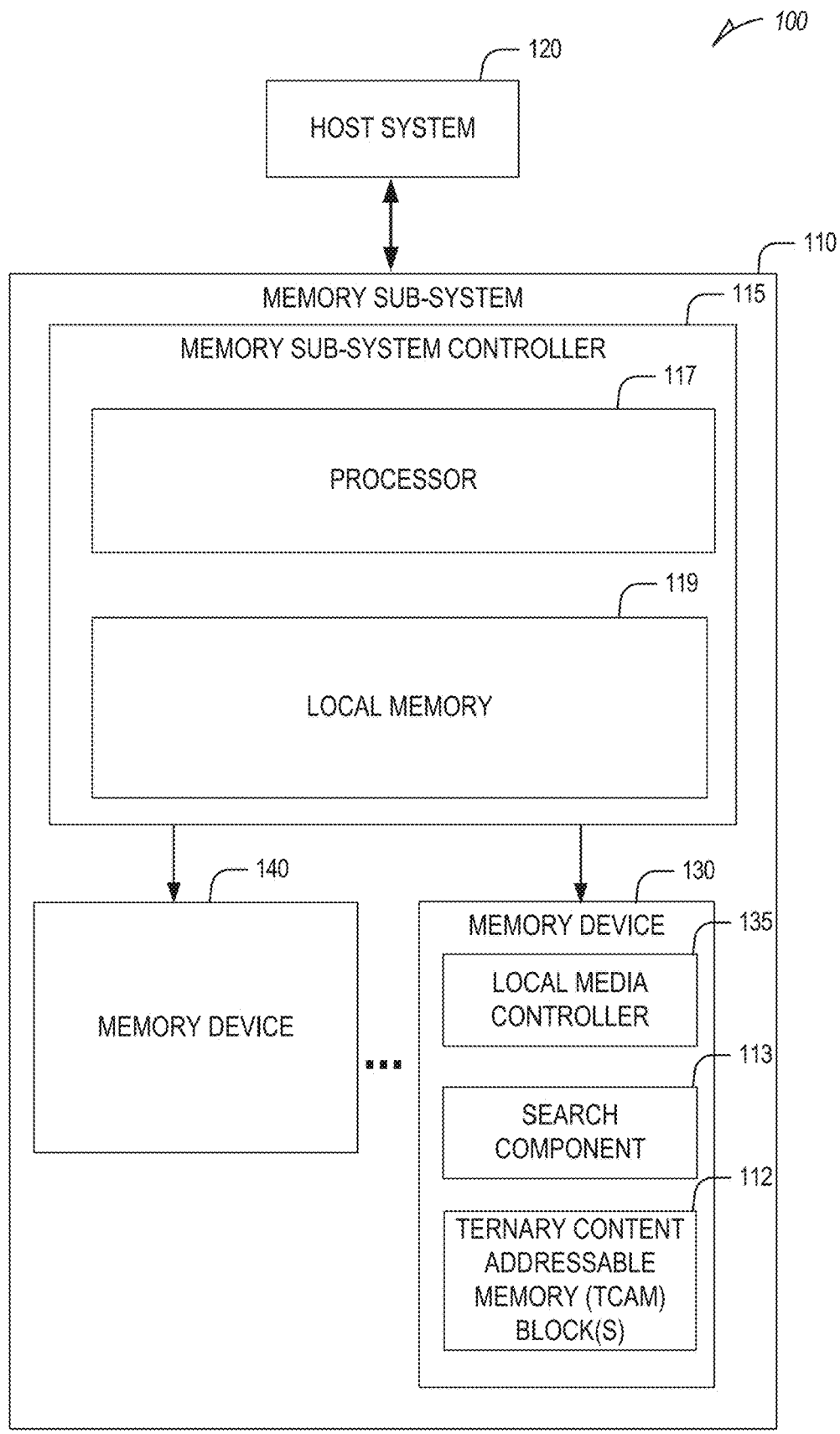
FIG. 1 illustrates an example computing system that includes a ternary content-addressable memory (TCAM) architecture implemented within a memory sub-system, in accordance with some embodiments of the present disclosure.

Aspects of the present disclosure are directed to a ternary content-addressable memory (TCAM) architecture for a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system. A memory sub-system controller receives commands or operations from the host system and converts the commands or operations into instructions or appropriate commands to achieve the desired access to the memory devices of the memory sub-system.

A content-addressable memory (CAM) is a special type of memory component that is used in certain very high speed searching applications such as identifier (ID) and pattern matching. Generally, a CAM is searched by comparing input search data against a table of stored data entries, and a memory address of matching data in the table is returned. CAMs are frequently implemented in dynamic random-access memory (DRAM), or synchronous random-access memory (SRAM). However, both DRAM and SRAM have a limited memory capacity, which limits the amount of data that can be stored and searched in conventional CAM implementations.

In certain artificial intelligence applications there is also a need for "inexact" matching, where certain bits deemed "don't-care" bits are ignored in the matching process, thereby allowing data entries to be searched for partial matches. That is, the searching process may ignore a first portion of a search word (i.e., corresponding to the don't-care bits) and identifying matching data that corresponds to a second portion of the search words (i.e., the remaining bits). Traditionally, this sort of inexact matching is facilitated using a ternary CAM (TCAM) implemented in SRAM. Such implementations typically require a large number of transistors per data bit (e.g., up to 16 transistors per data bit) and are therefore very limited in capacity and very expensive in die size.

A conventional negative—and (NAND)—type flash memory device may include one or more blocks. A NAND block includes a two-dimensional (2-D) array comprising pages (rows) and strings (columns). A three-dimensional (3D) NAND-type flash memory device includes multiple planes, each of which includes one or more blocks. A string includes a plurality of single cells (also referred to hereinafter simply as "memory cells"), such as NAND flash cells, connected in series. A single NAND flash cell includes a transistor that stores an electric charge on a memory layer that is isolated by oxide insulating layers above and below. Generally, when there is a charge on the memory layer of a memory cell, the memory cell is programmed and recognized by a memory sub-system as a binary value of 0. When the memory layer of a memory cell has no charge, it is erased and recognized as a binary value of 1.

A string is a unit to read in a NAND-type flash memory device. NAND-type flash devices typically have 32 or 64 or more memory cells. Conventionally, each memory cell is used to represent a bit value (0 or 1). Thus, in conventional implementations, a string with 32 memory cells can represent 32 bits of data and a string with 64 memory cells can represent 64 bits of data.

In a NAND-type flash memory block, individual strings are connected to allow storage and retrieval of data from selected cells. Typically, strings in the block are connected at one end to a common source line and at the other end to a bit line. Each string also contains two control mechanisms in series with the memory cells. String and ground select transistors are connected to the string select line and ground select line. Memory cells in NAND-type flash devices are connected horizontally at their control gates to a word line to form a page. A page is a set of connected memory cells that share the same word line and are the minimum unit to program. NAND-type flash memory devices may have page sizes of 64K or 128K cells. Although conventional NAND-type flash memory has a larger capacity than DRAM and SRAM, it is generally too slow for serial data searching and access.

Aspects of the present disclosure address the foregoing and other issues with a TCAM architecture implemented in a NAND-type flash memory device to provide both fast and high-capacity inexact search capability. Consistent with this architecture, data entries are stored on strings of a NAND-type flash memory array. Contrary to conventional NAND implementations, each bit of a data entry is mapped to a pair of memory cells that are configured to be complementary. That is, a first memory cell of the pair stores a bit value and a second memory cell of the pair stores an inverse of the bit value. A search pattern representing an input search word is input vertically on each word line corresponding to a string in the array block. A single read operation compares the input search word with all strings in the array block and identifies a storage address of matching data.

To allow for inexact matching, an indication of one or more don't-care bits are provided to the TCAM architecture as input. A search component configured from searching a TCAM block forces search lines of the TCAM block that correspond to the don't-care bits to be in a logical high state. In this way, memory cells corresponding to the don't-care bits are forced to return a positive match regardless of underlying values. In essence, this allows the underlying values to be ignored, thereby allowing the search component to identify stored data that matches the remaining portion of the search word.

A NAND-based TCAM architecture, as described herein, enables new applications where high-speed and high-density inexact pattern matching is required, such as applications related to artificial intelligence, machine vision, and large genetic databases. Such a TCAM architecture also improves existing database inexact search systems and algorithms such as index memories in cloud networking and servers.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and so forth.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, a double data rate (DDR) memory bus, Small Computer System Interface (SCSI), a dual in-line memory module (DIMM) interface (e.g., DIMM socket interface that supports Double Data Rate (DDR)). Open NAND Flash Interface (ONFI), Double Data Rate (DDR). Low Power Double Data Rate (LPDDR), and so forth. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes a NAND type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs. QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as NAND-type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM). Spin Transfer Torque (STT)-MRAM, conductive bridging RAM (CBRAM), resistive random access memory (RRAM), oxide based RRAM (OxRAM). NOR flash memory, and electrically erasable programmable read-only memory (EEPROM)

As shown, any one or more of the memory devices 130 can be configured to include one or more ternary content-addressable memory (TCAM) block(s) 113. A TCAM block 112 includes one or more arrays of memory cells organized as strings. Each string stores a data entry and includes memory cells connected in series between a match line and a page buffer. That is, a TCAM block 112 includes multiple match lines and each match line is connected to one of multiple strings in an array. The match lines of a TCAM block 112 correspond to bit lines of the NAND block on which the TCAM block 112 is implemented. Within a given string, memory cells are organized as complementary memory cell pairs. Each bit value of the data entry stored by a string is mapped to one of the complementary memory cell pairs in the string.

A TCAM block 112 can be searched by providing a search pattern as input to search lines of the TCAM block 112. The search lines of the TCAM block 112 correspond to word lines of the NAND block on which the TCAM block 112 is implemented. The match lines of the CAM block 112 are precharged to facilitate searching. That is, prior to input of the search, a voltage signal is applied to the match lines of the CAM block 112. During a search operation, if any matching data is stored by the TCAM 112, one or more matched lines (e.g., match lines corresponding strings storing the matching data) become conductive and discharge a signal in response to the search pattern input at the search lines. If no matching data is stored, all match lines are non-conductive. Each match line is further connected to a page buffer (e.g., includes one or more latches) that receives a discharge signal and stores data indicating that matched data is stored along the connected match line.

A memory sub-system controller 115 (or controller 115 for simplicity) can communicate with the memory devices 130 to perform operations such as reading data, writing data, or erasing data at the memory devices 130, and other such operations. The controller 115 can include hardware such as one or more integrated circuits and/or discrete components, a buffer memory, or a combination thereof. The hardware can include digital circuitry with dedicated (i.e., hard-coded) logic to perform the operations described herein. The controller 115 can be a microcontroller, special-purpose logic circuitry (e.g., a field-programmable gate array (FPGA), an application-specific integrated circuit (ASIC), etc.), or another suitable processor.

The controller 115 can include a processor 117 (e.g., processing device) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include ROM for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 also includes a search component 113 that facilitates searching of the one or more TCAM block(s) 112. Although illustrated as being part of the memory device 130, the search component 113 may, in some embodiments, be included in the controller 115 or the memory device 140. In some embodiments, the controller 115 includes at least a portion of the search component 113. For example, the controller 115 can include the processor 117 (processing device) configured to execute instructions stored in the local memory 119 for performing the operations of the search component 113 described herein. In some embodiments, the search component 113 is part of the host system 120, an application, or an operating system. In some embodiments, the local media controller 135 includes the search component 113.

The search component 113 generates a search pattern based on a received input search word and inputs the search pattern vertically along search lines of a TCAM block 112. As noted above, if matching data is stored by the TCAM block 112, the search pattern causes a match line storing the data entry (also referred to as a "matched line") to become conductive; since the match lines are precharged, a matched line provides a signal to a connected page buffer that indicates that the search word is stored thereon. A location (e.g., a storage address) of any matching data entry may be identified based on the signal provided by the matched line as a result of the string being conductive. More specifically, a page buffer connected to any matched line stores data in response to detecting a discharge signal that indicates that the matched data is stored along the matched line. A component of the search component 113 (e.g., a read-out circuit) may read data from the page buffer. Based on the data read from the page buffer, the search component 113 outputs an indication of whether the search word is stored by the TCAM block 112 and an indicator of the location of the match line.

To facilitate inexact matching, the search component 113 forces a portion of the search lines of the TCAM block 112 into a logical high state during a search operation. The search lines forced into the high state correspond to one or more bits in the search word specified as being don't-care bits. The one or more don't-care bits may be specified in input received from the host system 120. The host system 120 may select the one or more don't-care bits programmatically or based on user input. Forcing the search lines to the logical high state causes connected memory cells to be ignored for purposes of finding matching data because these connected memory cells become conductive regardless of the underlying value stored by the memory cells or the corresponding value of the search word represented by the search pattern. In this manner, matching data stored in the TCAM block 112 identified by the search component 113 corresponds to the remaining portion of the input search word. That is, the matching data corresponds to a portion of the input search word that excludes the don't-care bits.

Figure 2:
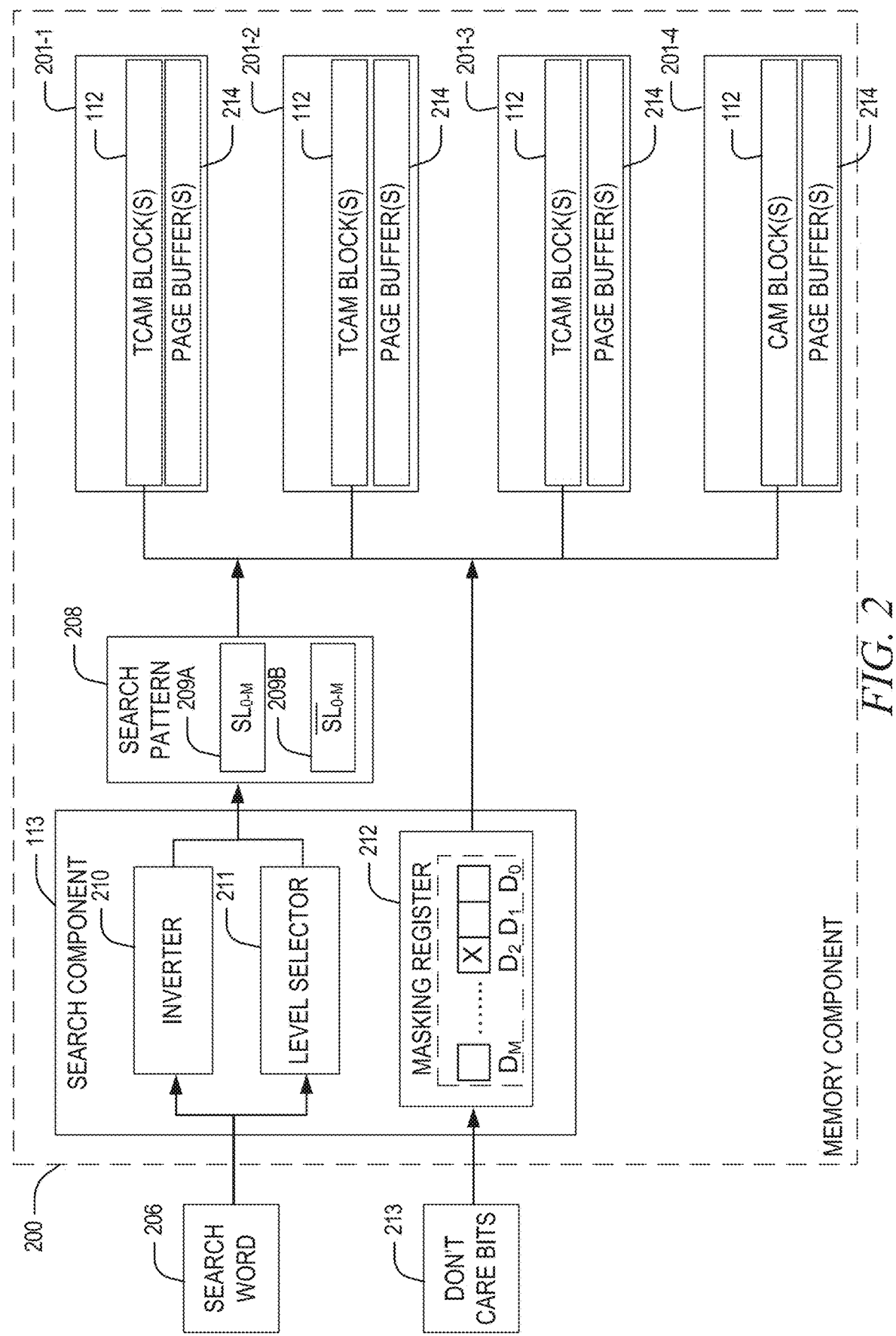
FIG. 2 is a block diagram illustrating additional details of the TCAM architecture implemented within the memory sub-system, in accordance with some embodiments of the present disclosure.

FIG. 2 is a block diagram illustrating additional details of the TCAM architecture implemented within the memory sub-system 110, in accordance with some embodiments of the present disclosure. As shown in FIG. 2, a memory device 200 may be organized into multiple planes—planes 201-1 to 201-4. The memory device 200 is an example of the memory devices 130. Although FIG. 2 illustrates the memory device 200 as comprising four planes, it shall be appreciated that the memory device 200 is not limited to four planes, and in other embodiments, may include more or fewer planes. Each of the planes 200-1 to 200-4 is configured to include one or more TCAM blocks 112. The number of TCAM blocks 112 per plane may be configured via software or hardware.

As shown, the search component 113 receives an input search word 206 and generates a search pattern 208 based on the input search word 206. The input search word 206 includes a first sequence of bits (e.g., "1011"). The search pattern 208 generated by the search component 113 includes a first set of voltage signals 209A ($SL_{0-M}$) representing the input search word and a second set of voltage signals 209B ($\overline{SL}_{0-M}$) representing a second sequence of bits comprising an inverse of the first sequence of bits (e.g., "0100"). The search component 113 includes an inverter 210 to generate an inverse of the input search word and a level selector 211 to generate the first and second voltage signals. In generating the first and second voltage signals, the level selector 211 may use voltage $V_{high}$ to represent a binary value of "1" and use a voltage $V_{low}$ to represent a binary value of "0" where $V_{high}$ is above a threshold voltage (Vt) and $V_{low}$ is below it.

As shown, the search component 113 also includes a masking register 212 to facilitate inexact matching. The search component 113 receives an indicator of don't-care bits 213 (e.g., from the host system 120) and writes the don't-care bits 213 to the masking register 212. In the example illustrated in FIG. 2, the masking register 212 is M-bits long, and an entry has been written to in the masking register 212 at $D_2$ indicating that the third bit in data entries stored in the TCAM block(s) 112 is a don't-care bit.

The search component 113 uses the masking register 212 to select search lines of the TCAM block(s) 112 to place into a logical high state during a search operation to force connected memory cells to return positive matches despite whether the underlying stored data value matches the corresponding bit value of the search word 206. The lines of the TCAM block(s) 112 set to the logical high state by the search component 113 correspond to corresponding to the don't-care bits 213. The search component 113 sets a search line to the logical high state by connecting the search line to a voltage source that supplies a voltage signal that corresponds to the logical high state. Following the notation set forth above, the search component 113 may set a search line to the logical high state by connecting the search line to $V_{high}$.

To search one of the TCAM block(s) 112, the search component 113 inputs the search pattern 208 vertically along search lines of the TCAM block 112 being searched. Input of the search pattern 208 causes any complementary memory cell pairs representing a matching stored bit value to become conductive. If a string is storing matching data, the entire string becomes conductive. Match lines in the TCAM block 112 are precharged (e.g., connected to $V_{high}$), and because the match lines are precharged, input of the search pattern 208 on the search lines causes any match lines in the block that are storing matching data (e.g., a data entry matching at least a portion of the search word 206) to output a discharge signal because the corresponding string is conductive. The discharge signal provides an indication that matching data is stored on the string connected to the match line.

Placing the don't-care bit search lines in the logical high state causes the connected memory cells to be ignored for purposes of finding matching data because these connected memory cells become conductive regardless of the underlying value stored by the memory cells or the corresponding value of the search word represented by the search pattern. In this manner, matching data in the context of inexact matching corresponds to a remaining portion of the input search word 206. That is, the matching data corresponds to a portion of the input search word 206 that excludes the don't-care bits 213.

Each string is connected between a match line and a page buffer (e.g., comprising one or more latch circuits) and the page buffer of a matched line stores data indicating matching data is stored along the matched line in response to the signal provided as a result of the match line discharging along the string. As shown, plane 201-4 includes page buffer(s) 214. A page buffer 214 may include one or more latch circuits. Physically, the page buffer(s) 214 may reside under or adjacent to the arrays of memory cells in which TCAM block(s) 112 are implemented.

A page buffer 214 latches data based on the signal provided by a matched line when matching data is stored by the connected string that conducts the signal to the page buffer 214. The search component 113 reads data from the page buffer(s) 214 and provides an indicator of whether the input search word 206 is stored in the TCAM block 112 being searched as output along with a location of the matching data (e.g., a memory address of the string in the array).

In some embodiments, the search component 113 may sequentially search for matching data in the TCAM block(s) 112 of the planes 201-1 to 201-4. That is, the search component 113 may initially search TCAM block(s) 112 of the plane 201-1, thereafter search TCAM block(s) 112 of the plane 200-2, thereafter search TCAM block(s) 112 of the plane 201-3, and finally search TCAM block(s) 112 of the plane 201-4.

In some embodiments, the search component 113 may search for matching data in the TCAM block(s) 112 of the planes 201-1 to 201-4 in parallel. That is, the search component 113 may simultaneously search all TCAM block(s) 112 of the planes 201-1 to 201-4 to find matching data. Parallel searching of the planes 201-1 to 201-4 allows all data entries stored among all TCAM block(s) 112 of the planes 201-1 to 201-4 to be searched in a single search operation rather than completing the search of all data entries in four separate search operations. Hence, parallel searching, as utilized in the embodiments described above, may allow the search component 113 to achieve an increase in search speed relative to embodiments in which sequential searching is utilized.

In some embodiments, data entries may be stored across two or more of the planes 201-1 to 201-4. In these instances, the search component 113 may simultaneously search for portions of matching data across two or more of the planes 201-1 to 201-4. Dividing data entries across planes allows for greater word size when compared to embodiments in which data entries are stored within a single plane. For example, if each of the TCAM blocks 112 supports 64-bit words, dividing the data entries among all four planes would allow the memory device 200 to support 256-bit words (4*64=256).

To avoid obscuring the inventive subject matter with unnecessary detail, various functional components that are not germane to conveying an understanding of the inventive subject matter have been omitted from FIG. 2. However, a skilled artisan will readily recognize that various additional functional components may be included as part of the memory sub-system 110 to facilitate additional functionality that is not specifically described herein. For example, the memory sub-system 110 may include additional circuitry (e.g., one or more multiplexers) that allows for conventional read and write operations to be performed with respect to any one of more of the memory devices 130 and 140.

Figure 3:
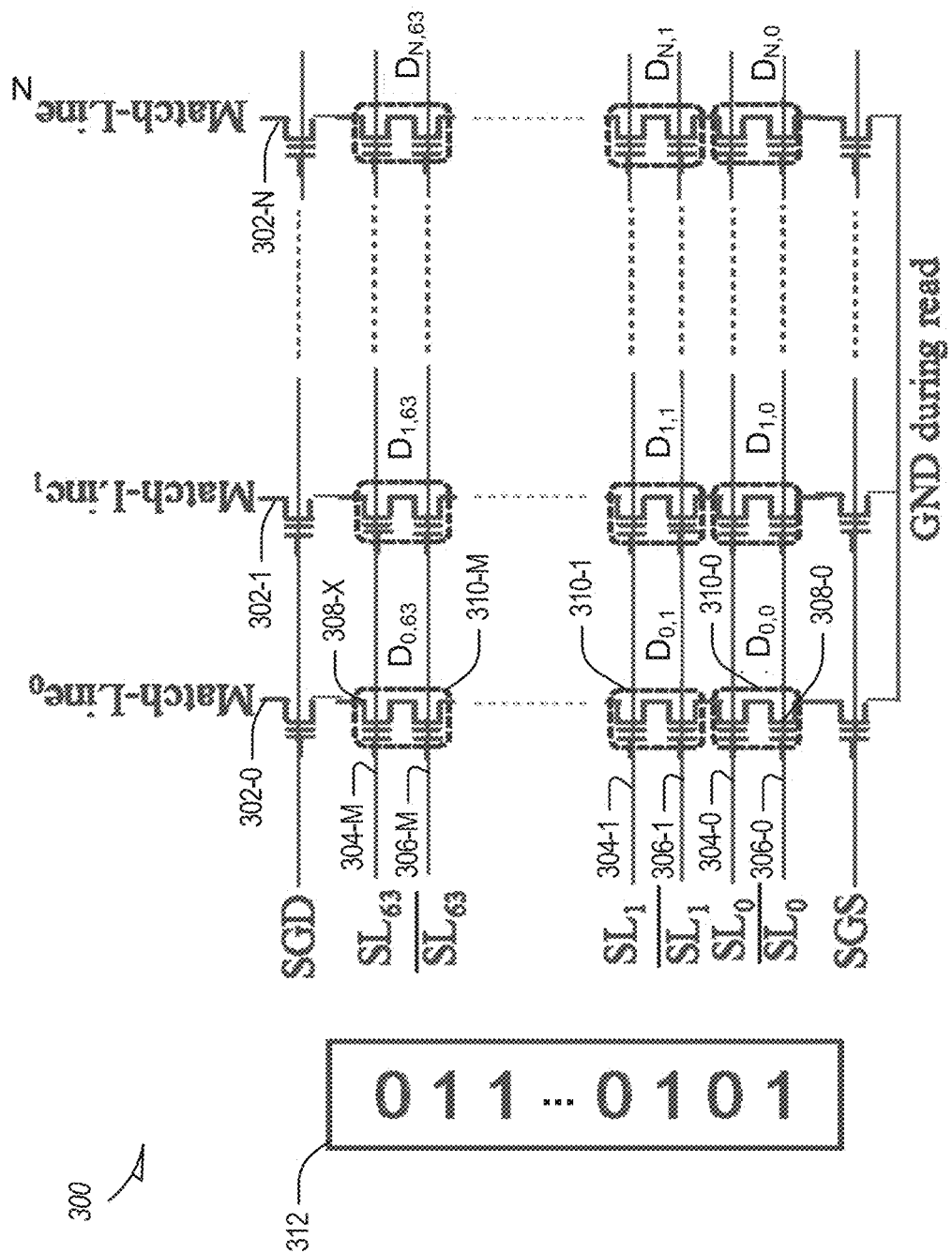
FIG. 3 illustrates components of a TCAM block implemented within a memory device in the example form of a NAND-type flash memory component, in accordance with some embodiments of the present disclosure.

FIG. 3 illustrates components of a TCAM block 300 implemented within the memory device 130 in the example form of a NAND-type flash memory device, in accordance with some embodiments of the present disclosure. The TCAM block 300 is an example of the TCAM block 112.

As shown, the TCAM block 300 includes match lines 302-0 to 302-N, search lines 304-0 to 304-M, and inverse search lines 306-0 to 306-M. In this implementation, the match lines 302-0 to 302-N of the TCAM block 300 correspond to bit lines of the NAND-type flash memory device, and the search lines 304-0 to 304-M and inverse search lines 306-0 to 306-M of the TCAM block 300 correspond to word lines of the NAND-type flash memory device.

Each of the match lines 302-0 to 302-N is connected to a string comprising a plurality of memory cells connected in series. For example, match line 302-0 is connected to a string comprising memory cells 308-0 to 308-X (where X=2M). Memory cells in each string of the TCAM block 300 are configured to be complementary pairs. For example, with the string connected to match line 302-0, memory cells 308-0 to 308-X are programmed as complementary memory cell pairs 310-0 to 310-M.

Figure 4:
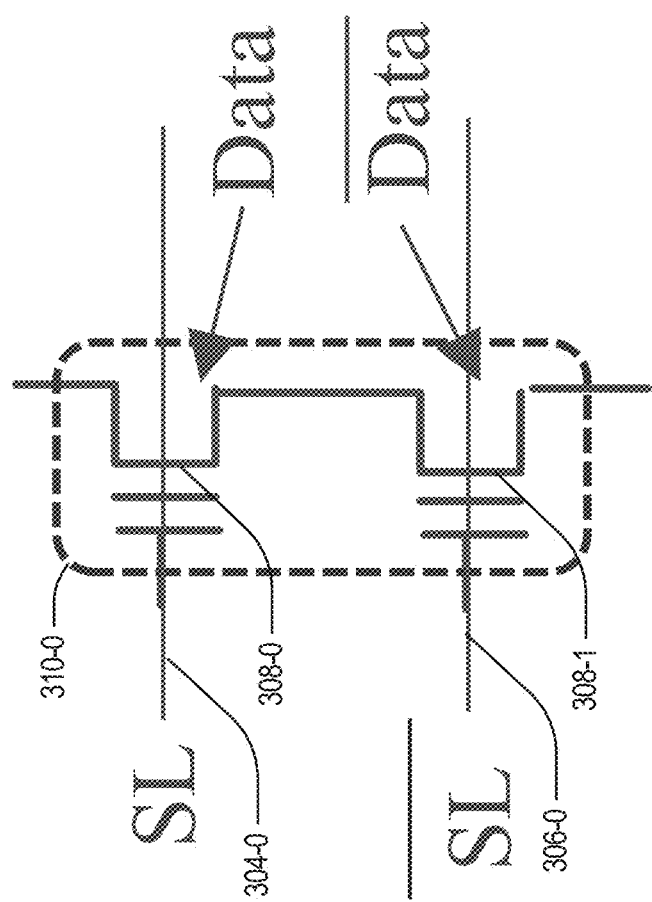
FIG. 4 illustrates a single TCAM cell of the TCAM block implemented within the NAND flash memory device, in accordance with some embodiments of the present disclosure.

Memory cell pairs are configured to be complementary in that one memory cell in the pair stores a data value ("0") and the other memory cell in the pair stores an inverse of the data value ("1"). For example, as shown in FIG. 4, memory cell pair 310-0 includes memory cells 308-0 and 308-1. Memory cell 308-0 stores a data bit value DATA, and memory cell 308-1 stores $\overline{\text{DATA}}$, which is an inverse of the data bit value DATA. Also, as shown in FIG. 3, search line 304-0 is connected to a control gate of the memory cell 308-0 and inverse search line 306-0 is connected to a control gate of the memory cell 308-1.

Search line 304-0 receives a first signal SL representing a search bit value from an input search word and inverse search line 306-0 receives a second signal $\overline{\text{SL}}$ representing an inverse of the search bit value. If SL matches DATA and $\overline{\text{SL}}$ matches $\overline{\text{DATA}}$, the memory cell pair 310-0 will be conductive. For example, TABLE 1 provided below is a truth table that defines the behavior of any given one of the memory cell pairs 310-0 to 310-M.

TABLE 1

| SL | $\overline{\text{SL}}$ | DATA | $\overline{\text{DATA}}$ | CONDUCTIVE |
|---|---|---|---|---|
| 0 | 1 | 0 | 1 | Yes |
| 0 | 1 | 1 | 0 | No |
| 1 | 0 | 0 | 1 | No |
| 1 | 0 | 1 | 0 | Yes |
| 1 | 1 | X | X | Yes |
| X | X | 0 | 0 | Yes |

In TABLE 1, a "DATA" value of "0" represents an erased state and a "DATA" value of "1" represents a programmed state for the memory cell. "SL" is a search bit value, "$\overline{\text{SL}}$" is an inverse of the search bit value, "DATA" is a stored bit value, and "$\overline{\text{DATA}}$" is an inverse of the stored bit value. As shown, a complementary cell pair is conductive when the search data value matches the stored data value and the inverse of the search data value matches the inverse of the stored data value. To facilitate inexact matching, if SL corresponds to a don't-care bit, both SL and $\overline{\text{SL}}$ are set to "1"

(a logical high value). As shown, in these instances, the complementary cell pair is conductive independent of the actual search bit or data bit.

The TCAM block 300 is also capable of stored data comprising one or more don't-care (X) bits. For example, as shown in Table 1, when DATA is indicated as being don't-care, a binary value of zero (a logical low state) is stored in both memory cells of the complementary cell pair to which DATA is mapped (e.g., memory cells 308-0 and 308-1 of the complementary memory cell pair 310-0). In these instances, the complementary memory cell pair will be conductive.

Returning to FIG. 3, each string in the TCAM block 300 stores a data entry and each data bit value in a data entry is mapped to one of the memory cell pairs 310-0 to 310-N in the string. In this way, within each of the complementary memory cell pairs in a string, a first memory cell stores a bit value from the data entry and a second memory cell stores an inverse of the bit value from the data entry unless the bit value is indicated as a don't-care bit, in which case both the first and second memory cells store a binary value of zero.

In an example where the NAND-type flash memory device supports 128-bit words (i.e., N is 128), the match line 302-0 is connected to memory cells 308-0 to 308-63, which store a 64-bit data entry comprising bit values $D_{0,0}$–$D_{63,63}$. In this example, bit value $D_{0,0}$ is mapped to memory cell pair 310-0 comprising memory cells 308-0 and 308-1. More specifically, memory cell 308-0 stores the bit value $D_{0,0}$ and the complementary memory cell 308-1 stores $\overline{D}_{0,0}$, which is the inverse of the bit value $D_{0,0}$.

A search pattern 312 may be input vertically along search lines 304-0 to 304-M and inverse search lines 306-0 to 306-M. More specifically, search lines 304-0 to 304-M receive a first set of voltage signals $SL_{0-M}$ representing a search word, and inverse search lines 306-0 to 306-M receive a second set of voltage signals $\overline{SL}_0$, m representing an inverse of the search word. Input of the search pattern 312 along the search lines causes any string that stores matching data to be conductive because, as discussed above, each individual memory cell pair in the string will be conductive. Because the match lines are precharged, a conductive string allows the match line to discharge. A page buffer connected to a conductive string latches data that indicates a location of matching data (i.e., the search word) in the TCAM block 300.

As noted above, to facilitate inexact matching, one or more of the search lines 304-0 to 304-M and a corresponding one or more of the inverse search lines 306-0 to 306-M may be set to a logical high state prior to or in parallel with the input of the search string. The search component 113 may set any search line to the logical high state by connecting the search line to a voltage source that provides a voltage signal corresponding to the logical high state (e.g., $V_{high}$). As an example, assume the second bit of the search word is a don't-care bit 213. Search line 304-1 and inverse search line 306-1 correspond to the second bit of the search word $SL_1$ and the second bit of stored data entries $D_1$. Accordingly, as part of performing this example search, the search component 113 sets the search line 304-1 and inverse search line 306-1 to logical high by connecting the search line 304-1 and inverse search line 306-1 to $V_{high}$. As a result, each of the complementary memory cell pairs connected to search line 304-1 and inverse search line 306-1 become conductive thereby indicating a positive match regardless of the underlying data stored or the actual corresponding value in the search pattern.

The search component 113 outputs an indication of whether matching data is stored by the TCAM block 300 and an indicator of the location (e.g., a memory address) of the matching data. In some embodiments, the search component 113 includes a read-out circuit that reads data from the page buffers of the TCAM block 300 to identify the location of the matching data.

In some embodiments, two or more page buffers in the TCAM block 300 may be tied together to form a serial shift register. Consistent with these embodiments, the search component 113 shifts data out of a first page buffer connected to a matched line to a second page buffer, and the search component 113 includes an output compare and counter component to track the number of shifts from one page buffer to the other to identify the location of matching data stored by the TCAM block 300.

Figure 5:
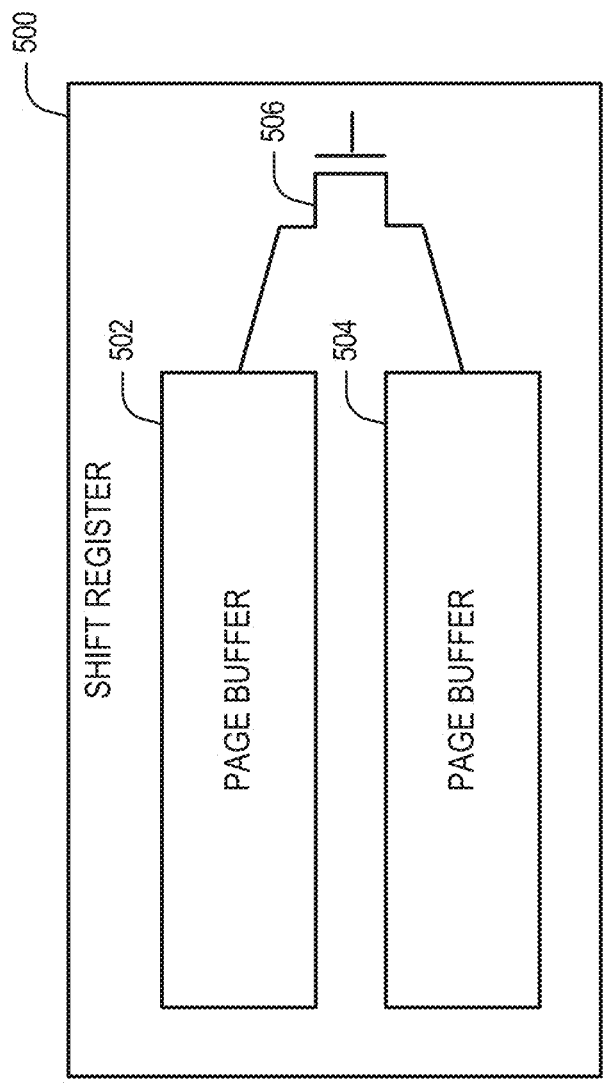
FIG. 5 is a block diagram illustrating a shift register, which may be included as part of the TCAM architecture, in accordance with some embodiments of the present disclosure.

The two page buffers may be tied together using a single transistor to form the shift register. For example, as shown in FIG. 5, shift register 500 includes page buffer 502 and page buffer 504 connected by transistor 506.

Figure 6:
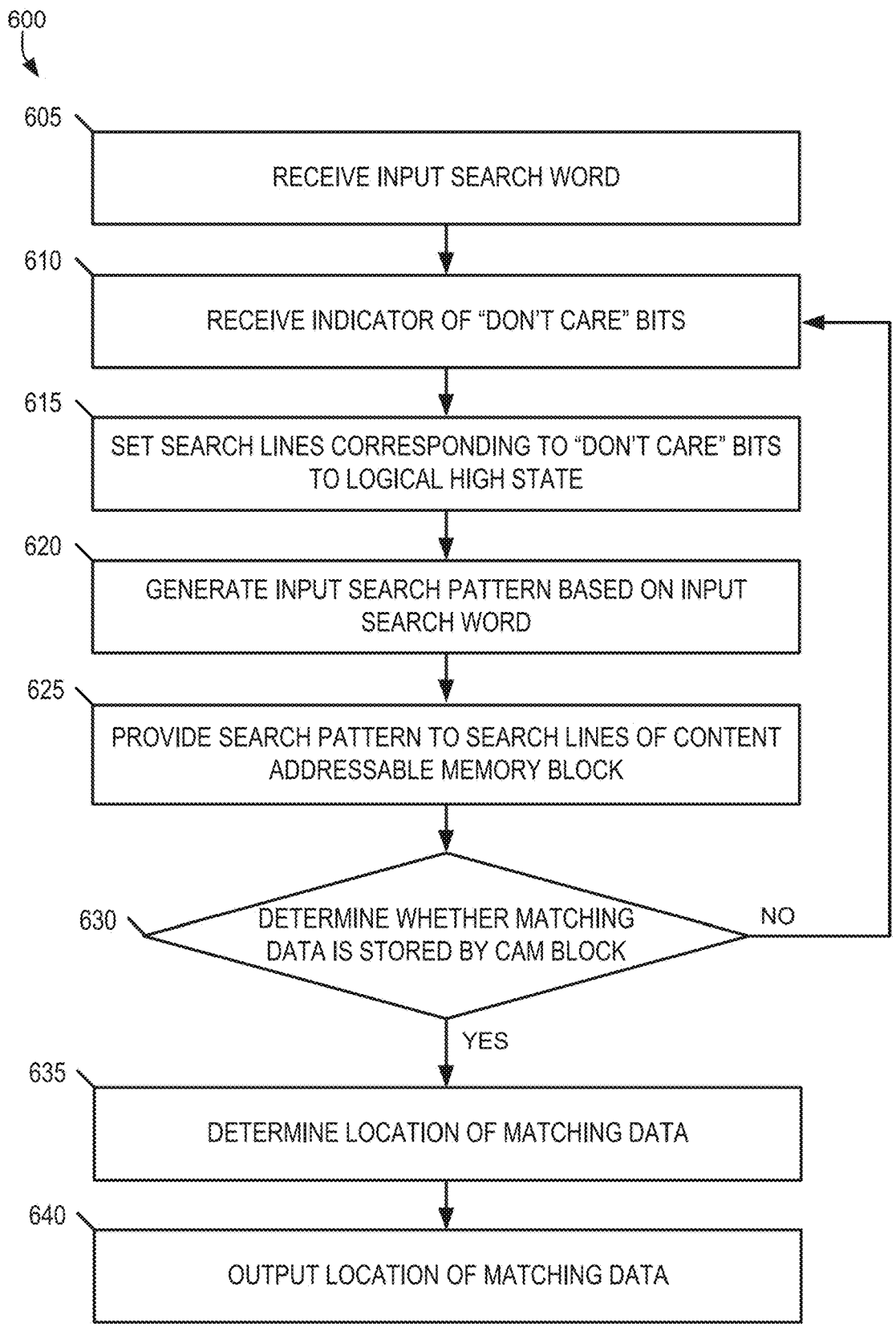
FIG. 6 is a flow chart illustrating example operations of the memory sub-system in performing an inexact search match on a TCAM, in accordance with some embodiments of the present disclosure.

FIG. 6 is flow diagram illustrating an example method 600 for inexact searching of a TCAM component in a memory sub-system, in accordance with some embodiments of the present disclosure. The method 600 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 600 is performed by the search component 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing device receives an input search word. The input search word may be received from a host system (e.g., the host system 120) in communication with the processing device. The input search word includes a first sequence of M-bits (e.g., "100110101011").

The processing device, at operation 610, receives an indicator of one or more bits in the first sequence of M-bits specified as don't-care bits. The don't-care bits of the search word can be ignored for the purposes of identifying matching data. The indicator of the don't-care bits may be received from the host system. The host system may select the one or more don't-care bits programmatically or based on user input. The one or more don't-care bits correspond to a first portion of the input word and the remaining portion of the search word (e.g., the portion not specified as being don't-care) is referred to as a "second portion" below.

The processing device sets a subset of search lines of a TCAM block to a logical high state based on the don't-care bits, at operation 615. The logical high state represents a binary value of 1. The processing device sets these search lines to the logical high state by connecting the search lines to a voltage signal representing the logical high state. Accordingly, the voltage signal has a corresponding voltage that is greater than a threshold voltage, where voltages below the threshold represent a logical low state and voltages above the threshold represent the logical high state.

The TCAM block includes an array (e.g., a NAND-type flash memory array) of memory cells. The memory cells of the array are arranged as strings and each of the strings stores a data entry. A string includes a plurality of memory cells connected in series between a precharged match line and a page buffer. The match line is precharged in that it is connected to a voltage signal (e.g., representing a logical high state). The TCAM block further includes a plurality of search lines, and each of the memory cells in each string are connected to one of a plurality of search lines.

The subset of search lines of the TCAM block set to the logical high state correspond to the don't-care bits of the input search word. That is, the subset of search lines of the TCAM block that are set to the logical high state are connected to memory cells that store data values corresponding to the don't-care bits in the input search word. For example, as noted above, memory cells in each string are organized as complementary memory cell pairs. Each bit value of a data entry stored by a sting is mapped to a complementary memory cell pair in the string. In particular, a first memory cell stores the bit value and the second memory cell stores the inverse of the bit value. More specifically, a first memory cell stores a first charge representing the bit value and the second memory cell stores a second charge representing the inverse of the bit value. Hence, for each don't-care bit, both search lines that correspond to a bit value at the position of the don't-care bit are set to a logical high state. That is, for each of the complementary memory cell pairs in the array that represent a bit value at the position of the don't-care bit, a first search line connected to the first memory cell that stores a data value is set to a logical high state and a second line connected to the second memory cells that stores an inverse of the data value is also set to a logical high state.

At operation 620, the processing device generates a search pattern based on the input search word. The search pattern includes a first set of voltage signals representing the search word. That is, the first set of voltage signals represents the first sequence of M-bits. The search pattern further includes a second set of voltage signals representing a second sequence of M-bits comprising an inverse of the first sequence of bits (e.g., "0110 0101 0100"). Accordingly, in generating the search pattern, the processing device generates the second sequence of bits by inverting the input search word and converts the first and second sequence of bits into the first and second signals, respectively. The processing device may alternatively generate a first signal based on the first sequence of bits and generate the second signal by generating an inverse of the first signal. In generating the first and second voltage signals, the processing device may use voltage $V_{high}$ to represent a binary value of "1" and use a voltage $V_{low}$ to represent a binary value of "0" where $V_{high}$ is above a threshold voltage (Vt) and $V_{low}$ is below Vt.

The processing device provides the search pattern to search lines of a TCAM block (at operation 625). Regardless of the values represented by the search pattern, the subset of search lines of the TCAM block set to the logical high state remain in the logical high state. In providing the search pattern to the search lines of the TCAM, the processing device provides a first signal representing a search bit value from the first bit sequence to a first search line connected to a first memory cell in a complementary memory cell pair and provides a second search signal representing an inverse of the search bit value to a second search line connected to a second memory cell in the complementary memory cell pair.

If a second portion of the input search word (e.g., the portion that excludes the don't-care bits) is stored in the TCAM block, input of the search pattern causes the string on which the second portion of input search word is stored to become conductive. Because matched lines arc precharged, the conductive string allows the match line to discharge. That is, the string conducts a signal resulting from the match line discharging based on the data entry stored on the string connected to the match line matching the second portion of the input search word. The conductive string provides the signal to a page buffer connected at the other end of the string. The page buffer latches data in response to the signal provided as a result of the match line discharging. The latched data indicates that the match line connected to the page buffer stores a data entry that matches at least the second portion of the input search word.

At operation 630, the processing device determines whether any matching data is stored by the TCAM block. For the purpose of inexact matching, the matching data includes the second portion of the input search word but may exclude the first portion. The processing device may determine whether any matching data is stored by the TCAM block by reading data from the page buffer of the TCAM block.

If, at operation 630, the processing device determines that no matching data is stored by the TCAM block, the processing device may return to operation 610 and repeat the process described again using at least one new don't-care bit. An indicator of the at least one new don't-care bit may again be provided by the host system at operation 610. That is, a first set of don't-care bits may be provided, and if no matching data is identified based on the first set of don't-care bits, a second set of don't-care bits may be provided, and the processing device searches the TCAM block for matching data based on the second set of don't-care bits.

If the processing device determines that matching data is stored by the TCAM block, the processing device, at operation 635, determines a location of any matching data stored in the TCAM block. That is, the processing device determines the location of a stored data entry that matches the second portion of the input search word. The processing device may determine the location of matching data based on the data read from the page buffer. The location of matching data may include one or more memory addresses corresponding to one or more strings within the array.

The processing device, at operation 640, outputs an indication of whether matching data is stored by the TCAM block and the location of the matching data. The location of the matching data may, for example, be used to retrieve additional data associated to the input search word stored by the memory sub-system. The associated data may be stored in a different portion of the memory device on which the TCAM block is implemented or on another memory device of the memory sub-system.

Example 1 is a system comprising: a memory device comprising a ternary content-addressable memory (TCAM) block comprising an array of memory cells organized into a plurality of strings, a string in the plurality of strings storing a data entry, the string comprising a plurality of memory cells connected in series between a precharged match line and a page buffer, each of the memory cells connected to one of a plurality of search lines; and a processing device coupled to the memory device, the processing device to perform operations comprising: receiving an input search word comprising a sequence of bits; receiving an indicator of one or more don't-care bits in the sequence of bits, the one or more don't-care bits corresponding to a first portion of the input search word; setting a subset of the plurality of search lines to a logical high state, the subset of the plurality of search lines corresponding to the one or more don't-care bits; generating a search pattern based on the input search word; providing the search pattern as input to the plurality of search lines, the search pattern causing the string to be conductive and provide a signal to the page buffer in response to the data entry stored on the string matching at least a second portion of the input search word that excludes the one or more don't-care bits, the signal resulting from the precharged match line discharging through the string, the page buffer storing data in response to the signal; and outputting a location of the data entry within the TCAM block based on the data read by the page buffer.

In Example 2, the plurality of memory cells of Example 1 is optionally configured as a plurality of complementary memory cell pairs and a bit value of the data entry is mapped to a complementary memory cell pair in the plurality of complementary memory cell pairs.

In Example 3, the subject matter of any one of Examples 1 and 2 optionally comprises a complementary memory cell pair comprising: a first memory cell to store a bit value of the data entry, and a second memory cell connected in series with the first memory cell, the second memory cell to store an inverse of the bit value, wherein a first search line in the plurality of search lines is connected to the first memory cell; and wherein a second word line in the plurality of word lines is connected to the second memory cell.

In Example 4, the subject matter of any one of Examples 1-3 optionally comprises a first search line to receive a first search signal representing a search bit value from the input search word, and a second search line to receive a second search signal representing an inverse of the search bit value.

In Example 5, the search pattern of any one of the Examples 1-4 optionally comprises a first set of signals representing the input search word and a second set of signals representing an inverse of the input search word.

In Example 6, the subject matter of any one of the Examples 1-5 optionally comprises an inverter to generate an inverse of the sequence of bits; and a level shifter to generate a first set of signals based on the first sequence of bits and to generate a second set of signals based on the inverse of the sequence of bits.

In Example 7, the subject matter of any one of Examples 1-6 optionally comprises determining whether matching data is stored by the TCAM block based on the data read by the page buffer, the matching data comprising at least the second portion of the input search word; and outputting an indication of whether matching data is stored by the TCAM block.

Example 8 includes the subject matter of Examples 1-7, wherein the one or more don't-care bits is a first set of don't-care bits; the subset of the plurality of search lines is a first subset; and the operations further optionally comprise: receiving a second set of don't-care bits prior to receiving the first set of don't-care bits; setting a second subset of the plurality of search lines to a logical high state, the second subset of the plurality of search lines corresponding to a second set of don't-care bits; determining that matching data is not stored by the TCAM; and wherein the first set of don't-care bits is provided based on determining that matching data is not stored by the TCAM.

In Example 9, the location of the data entry of any one of Examples 1-8 optionally comprises a memory address of the string within the CAM block.

In Example 10, the memory device of any one of Examples 1-9 optionally comprises a comprises a negative and (NAND)-type flash memory device.

Example 11 is a method comprising: receiving an input search word comprising a first sequence of bits; receiving an indicator of one or more don't-care bits in the first sequence of bits, the one or more don't-care bits corresponding to a first portion of the input search word; setting a subset of a plurality of search lines of a ternary content-addressable memory (TCAM) block to a logical high state, the subset of the plurality of search lines corresponding to the one or more don't-care bits; generating a search pattern based on the input search word; providing the search pattern to the plurality of search lines of the TCAM, the search pattern causing a string in the TCAM to be conductive and to provide a signal to a page buffer in response to the string storing matching data, the matching data comprising a second portion of the input search word that excludes the don't-care bits, the signal resulting from a precharged match line discharging through the string, the page buffer storing data in response to the signal; and outputting a location of the data entry within the TCAM block based on the data read by the page buffer.

In Example 12, the plurality of memory cells of Example 11 is optionally configured as a plurality of complementary memory cell pairs and a bit value of the data entry is mapped to a complementary memory cell pair in the plurality of complementary memory cell pairs.

In Example 13, the subject matter of any one of Examples 11 and 12 optionally comprises a complementary memory cell pair comprising: a first memory cell to store a bit value of the data entry, and a second memory cell connected in series with the first memory cell, the second memory cell to store an inverse of the bit value, wherein a first search line in the plurality of search lines is connected to the first memory cell; and wherein a second word line in the plurality of word lines is connected to the second memory cell.

In Example 14, the providing of the search pattern as input in any one of Examples 11-13 optionally comprises: providing, to the first search line, a first search signal representing a search bit value from the input search word, and providing, to the second search line, a second search signal representing an inverse of the search bit value.

In Example 15, the subject matter of any one of Examples 11-14 optionally comprises determining whether matching data is stored by the TCAM block based on the data read by the page buffer, the matching data comprising at least the second portion of the input search word; and outputting an indication of whether matching data is stored by the TCAM block.

In Example 16, the subject matter of any one of Examples 11-15 optionally comprises determining the location of the data entry by reading the data out of the page buffer, the data indicating the location of the string.

In Example 17, the search pattern of any one of Examples 11-16 optionally comprises a first set of signals representing the input search word and a second set of signals representing an inverse of the sequence of bits.

In Example 18, the sequence of bits is a first sequence of bits, the generating of the search pattern in any one of Examples 11-17 optionally comprises: inverting the first sequence of bits to generate the second sequence of bits; generating a first voltage signal representing the first sequence of bits; and generating a second voltage signal representing the second sequence of bits.

In Example 19, the location of the data entry of any one of Examples 11-18 optionally comprises a memory address of the string within the TCAM block.

Example 20 is a non-transitory computer-readable storage medium comprising instructions that, when executed by a processing device, configure the processing device to perform operations comprising: receiving an input search word comprising a first sequence of bits; receiving an indicator of one or more don't-care bits in the rust sequence of bits, the one or more don't-care bits corresponding to a first portion of the input search word; setting a subset of a plurality of search lines of a ternary content-addressable memory (TCAM) block to a logical high state, the subset of the plurality of search lines corresponding to the one or more don't-care bits; generating a search pattern based on the input search word; providing the search pattern as input to the plurality of search lines of the TCAM, the search pattern causing a string to be conductive and to provide a signal to a page buffer in response to the string storing matching data, the matching data comprising a second portion of the input search word that excludes the don't-care bits, the signal resulting from a precharged match line discharging through the string, the page buffer storing data in response to the signal; and outputting a location of the data entry within the TCAM block based on the data read by the page buffer.

Figure 7:
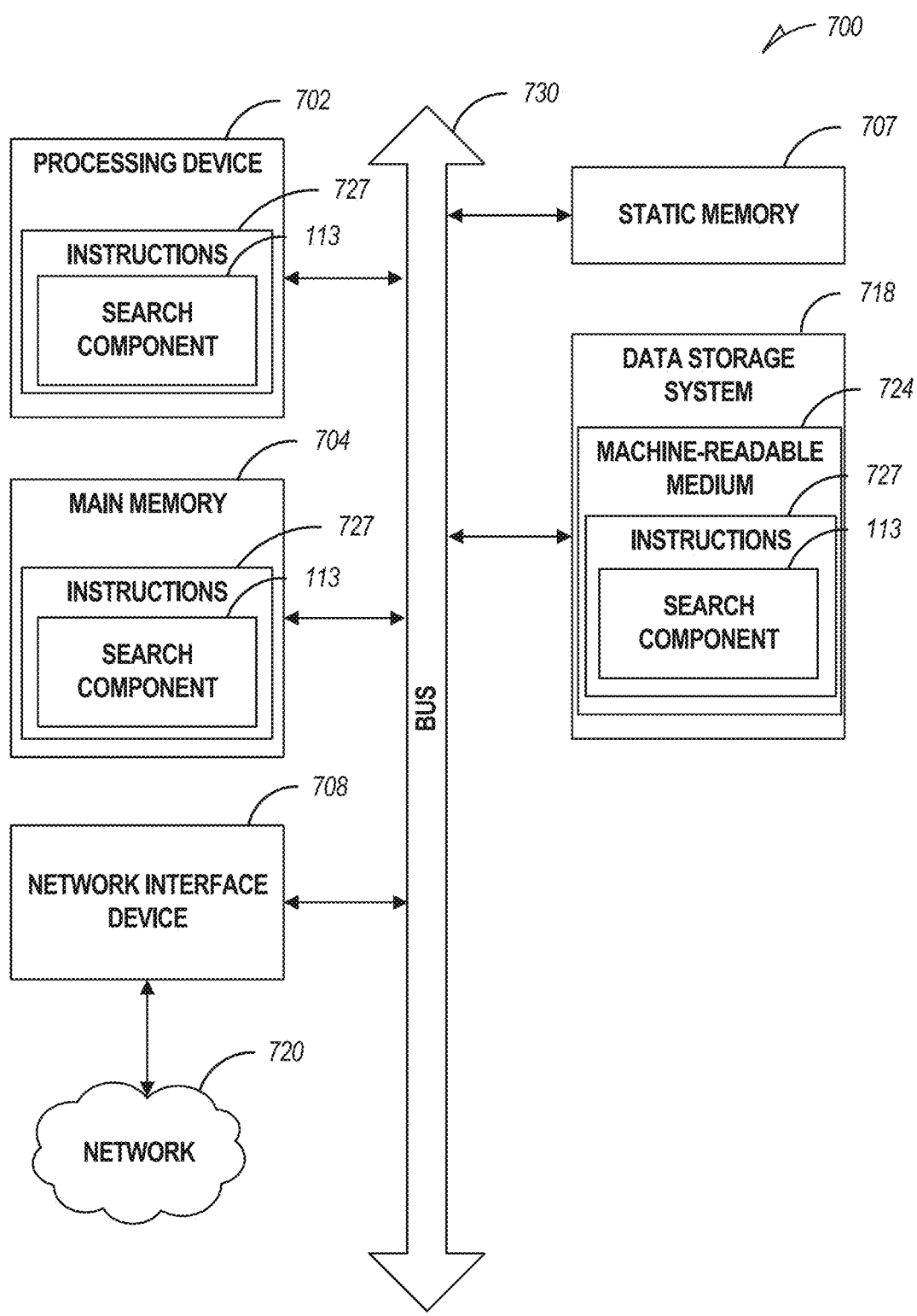
FIG. 7 is a block diagram of an example computer system in which embodiments of the present disclosure may operate.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the search component 113 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., ROM, flash memory. DRAM such as SDRAM or Rambus DRAM (RDRAM), etc.), a static memory 707 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an ASIC, an FPGA, a digital signal processor (DSP), a network processor, or the like. The processing device 702 is configured to execute instructions 726 for performing the operations and steps discussed herein. The computer system 700 can further include a network interface device 708 to communicate over a network 720.

The data storage system 718 can include a machine-readable storage medium 724 (also known as a computer-readable medium) on which is stored one or more sets of instructions 727 or software embodying any one or more of the methodologies or functions described herein. The instructions 727 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 727 include instructions to implement functionality corresponding to a security component (e.g., the search component 113 of FIG. 1). While the machine-readable storage medium 724 is shown in an example embodiment to be a single medium, the term "machine-readable storage medium" should be taken to include a single medium or multiple media that store the one or more sets of instructions 727. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks. CD-ROMs, and magnetic-optical disks; ROMs; RAMs; erasable programmable read-only memories (EPROMs); EEPROMs;

magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., a computer-readable) storage medium such as a ROM, a RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
a memory device comprising a ternary content-addressable memory (TCAM) block comprising a plurality of strings, a string in the plurality of strings comprising a plurality of memory cells connected in series to a page buffer, each of the memory cells connected to one of a plurality of search lines; and
a processing device coupled to the memory device, the processing device to perform operations comprising:
receiving an input search word and an indicator of an ignorable portion of the input search word;
generating a search pattern based on the input search word;
providing the search pattern as input to the plurality of search lines, the search pattern causing the page buffer to store data indicative of a location of matching data within the TCAM block, the matching data including a remaining portion of the input search word, the remaining portion of the input search word excluding the ignorable portion of the input search word; and
outputting the location of the matching data within the TCAM block based on the data stored by the page buffer.

2. The system of claim 1, wherein:
the input search word comprises a sequence of bits; and
the ignorable portion of the input search word corresponding to one or more don't care bits in the sequence of bits.

3. The system of claim 1, wherein the processing device is further configured to set a subset of the plurality of search lines to a logical high state, the subset of the plurality of search lines corresponding to the ignorable portion of the input search word.

4. The system of claim 1, wherein the search pattern causes the string to be conductive and provide a signal to the page buffer in response to a data entry stored by the string matching the remaining portion of the input search word.

5. The system of claim 4, wherein:
the plurality of memory cells are connected in series between a precharged match line and the page buffer; and
the signal results from the precharged match line discharging through the string.

6. The system of claim 1, wherein:
the matching data corresponds to a data entry stored on the string;
the plurality of memory cells is configured as a plurality of complementary memory cell pairs, and
a bit value of the data entry is mapped to a complementary memory cell pair in the plurality of complementary memory cell pairs.

7. The system of claim 6, wherein:
the complementary memory cell pair comprises:
a first memory cell to store a bit value of the data entry, and
a second memory cell connected in series with the first memory cell, the second memory cell to store an inverse of the bit value;
a first search line in the plurality of search lines is connected to the first memory cell; and
a second search line in a plurality of search lines is connected to the second memory cell.

8. The system of claim 7, wherein:
the first search line receives a first signal representing a search bit value from the input search word, and
the second search line receives a second signal representing an inverse of the search bit value.

9. The system of claim 1, wherein the location of the matching data comprises a memory address of the string within the TCAM block.

10. The system of claim 1, wherein the operations further comprise:
outputting an indication of whether the matching data is stored by the TCAM block.

11. A method comprising:
receiving an input search word and an indicator of an ignorable portion of the input search word;
generating a search pattern based on the input search word;
providing the search pattern as input to a plurality of search lines of a ternary content-addressable memory (TCAM) block, the search pattern causing a page buffer in the TCAM block to store data indicative of a location of matching data within the TCAM block, the matching data including a remaining portion of the input search word, the remaining portion of the input search word excluding the ignorable portion of the input search word; and
outputting the location of the matching data within the TCAM block based on the data stored by the page buffer.

12. The method of claim 11, wherein:
the input search word comprises a sequence of bits; and
the ignorable portion of the input search word corresponding to one or more don't care bits in the sequence of bits.

13. The method of claim 11, further comprising setting a subset of the plurality of search lines to a logical high state, the subset of the plurality of search lines corresponding to the ignorable portion of the input search word.

14. The method of claim 11, wherein:
the TCAM block comprises a plurality of strings,
a string in the plurality of strings comprising a plurality of memory cells connected in series to the page buffer, and
the search pattern causes the string to be conductive and provide a signal to the page buffer in response to a data entry stored by the string matching the remaining portion of the input search word.

15. The method of claim 14, wherein:
the plurality of memory cells are connected in series between a precharged match line and the page buffer; and
the signal results from the precharged match line discharging through the string.

16. The method of claim 14, wherein:
the matching data corresponds to a data entry stored on the string;
the plurality of memory cells is configured as a plurality of complementary memory cell pairs, and
a bit value of the data entry is mapped to a complementary memory cell pair in the plurality of complementary memory cell pairs.

17. The method of claim 16, wherein:
the complementary memory cell pair comprises:
a first memory cell to store a bit value of the data entry, and
a second memory cell connected in series with the first memory cell, the second memory cell to store an inverse of the bit value;
a first search line in the plurality of search lines is connected to the first memory cell; and
a second search line in a plurality of search lines is connected to the second memory cell.

18. The method of claim 17, wherein:
the first search line receives a first signal representing a search bit value from the input search word, and
the second search line receives a second signal representing an inverse of the search bit value.

19. The method of claim 11, wherein:
the input search word comprises is a first sequence of bits; and
the generating of the search pattern comprises:
inverting the first sequence of bits to generate a second sequence of bits;
generating a first voltage signal representing the first sequence of bits; and
generating a second voltage signal representing the second sequence of bits.

20. A non-transitory computer-readable storage medium comprising instructions that, when executed by a memory sub-system controller, configure the memory sub-system controller to perform operations comprising:
receiving an input search word and an indicator of an ignorable portion of the input search word;
generating a search pattern based on the input search word;
providing the search pattern as input to a plurality of search lines of a ternary content-addressable memory (TCAM) block, the search pattern causing a page buffer in the TCAM block to store data indicative of a location of matching data within the TCAM block, the matching data including a remaining portion of the input search word, the remaining portion of the input search word excluding the ignorable portion of the input search word; and
outputting the location of the matching data within the TCAM block based on the data stored by the page buffer.

* * * * *